(12) United States Patent
Shon et al.

(10) Patent No.: US 8,938,077 B2
(45) Date of Patent: Jan. 20, 2015

(54) SOUND SOURCE PLAYING APPARATUS FOR COMPENSATING OUTPUT SOUND SOURCE SIGNAL AND METHOD OF COMPENSATING SOUND SOURCE SIGNAL OUTPUT FROM SOUND SOURCE PLAYING APPARATUS

(75) Inventors: Jun-il Shon, Yongin-si (KR); Dong-wook Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 484 days.

(21) Appl. No.: 12/858,077

(22) Filed: Aug. 17, 2010

(65) Prior Publication Data

US 2011/0044473 A1  Feb. 24, 2011

(30) Foreign Application Priority Data

Aug. 18, 2009 (KR) .................. 10-2009-0076392

(51) Int. Cl.
*H04R 29/00* (2006.01)
*H03G 5/16* (2006.01)

(52) U.S. Cl.
CPC ..................................... *H03G 5/165* (2013.01)
USPC ................ 381/60; 381/98; 381/315

(58) Field of Classification Search
USPC ............................ 381/60, 98, 315
See application file for complete search history.

(56) References Cited

U.S. PATENT DOCUMENTS

| 7,288,072 B2* | 10/2007 | Stott et al. ............ 600/559 |
| 2001/0033664 A1* | 10/2001 | Poux et al. ............ 381/60 |
| 2008/0049946 A1* | 2/2008 | Heller et al. ............ 381/60 |
| 2009/0167702 A1 | 7/2009 | Nurmi | |

FOREIGN PATENT DOCUMENTS

| JP | 2006-042170 A | 2/2006 |
| JP | 2009-027280 A | 2/2009 |
| KR | 1020060072555 A | 6/2006 |
| KR | 1020100022880 A | 3/2010 |

* cited by examiner

*Primary Examiner* — Davetta W Goins
*Assistant Examiner* — Amir Etesam
(74) *Attorney, Agent, or Firm* — Cantor Colburn LLP

(57) ABSTRACT

A method of selecting a compensation method to compensate a sound source signal output from a sound source playing apparatus includes; displaying a plurality of areas indicating each of a plurality of compensation methods with respect to a signal output from the sound source playing apparatus, outputting a test signal compensated by a compensation method of the plurality of compensation methods, the compensation method corresponding to at least one area of the plurality of areas, selecting any one of the plurality of areas based on a response of a user to the output test signal, and storing the compensation method corresponding to the selected area.

15 Claims, 5 Drawing Sheets

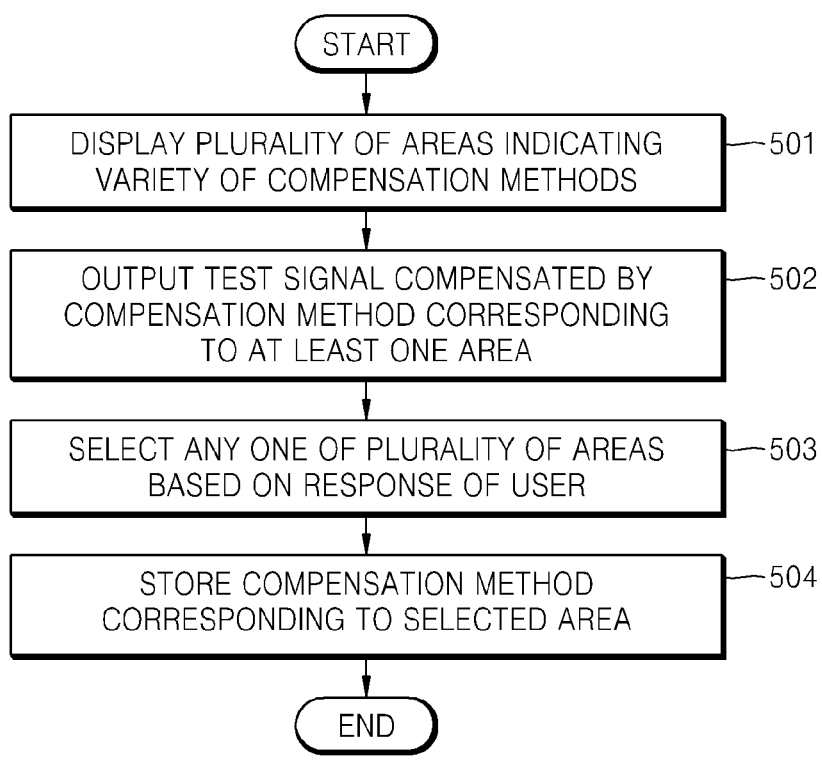

SOUND SOURCE PLAYING APPARATUS FOR COMPENSATING OUTPUT SOUND SOURCE SIGNAL AND METHOD OF COMPENSATING SOUND SOURCE SIGNAL OUTPUT FROM SOUND SOURCE PLAYING APPARATUS

CROSS-REFERENCE TO RELATED APPLICATION

This application claims priority to Korean Patent Application No. 10-2009-0076392, filed on Aug. 18, 2009, and all the benefits accruing therefrom under 35 U.S.C. §119, the content of which in its entirety is herein incorporated by reference.

BACKGROUND

1. Field

The present disclosure relates to a sound source playing apparatus for compensating an output sound source signal, and a method of compensating a sound source signal output from a sound source playing apparatus.

2. Description of the Related Art

With an increase in the use of sound apparatuses, e.g., personal music players, an increase in the number of aged people, and the exposure of the populace to a noisy environment, the population of the hearing impaired has increased. A hearing test may be performed by observing the reaction of a user who hears a pure tone whose frequency and amplitude vary.

SUMMARY

Provided is a method of compensating a sound source signal output from a sound source playing apparatus based on hearing characteristic of a user, and a sound source playing apparatus for compensating a sound source signal based on the hearing characteristic of the user.

Provided is a computer readable recording medium having recorded thereon a program for executing the above-described method in a computer.

Additional aspects will be set forth in part in the description which follows and, in part, will be apparent from the description, or may be learned by practice of the presented embodiments.

According to an aspect of the present disclosure, there is provided a method of selecting a compensation method to compensate a sound source signal output from a sound source playing apparatus, the method including; displaying a plurality of areas indicating each of a plurality of compensation methods with respect to a signal output from the sound source playing apparatus, outputting a test signal compensated by a compensation method of the plurality of compensation methods, the compensation method corresponding to at least one area of the plurality of areas, selecting any one of the plurality of areas based on a response of a user to the output test signal, and storing the compensation method corresponding to the selected area.

According to another aspect of the present invention, there is provided a computer readable recording medium having recorded thereon a program for executing the above method of selecting a compensation method to compensate a sound source signal output from a sound source playing apparatus.

According to another aspect of the present invention, there is provided a sound source playing apparatus which outputs a sound source signal, the sound source playing apparatus including; a user interface unit which displays a plurality of areas corresponding to each of a plurality of compensation methods with respect to a signal output from the sound source playing apparatus, an output unit for which outputs a test signal compensated by a compensation method corresponding to at least one of the plurality of areas, a processor which selects any one of the plurality of areas based on a response of a user to the output test signal, and a memory which stores a compensation method corresponding to the selected area.

BRIEF DESCRIPTION OF THE DRAWINGS

These and/or other aspects will become apparent and more readily appreciated from the following description of the embodiments, taken in conjunction with the accompanying drawings of which:

FIG. 5 is a flowchart illustrating an embodiment of a method of selecting a compensation method to compensate a sound source signal output from a sound source playing apparatus.

DETAILED DESCRIPTION

Figure 1:
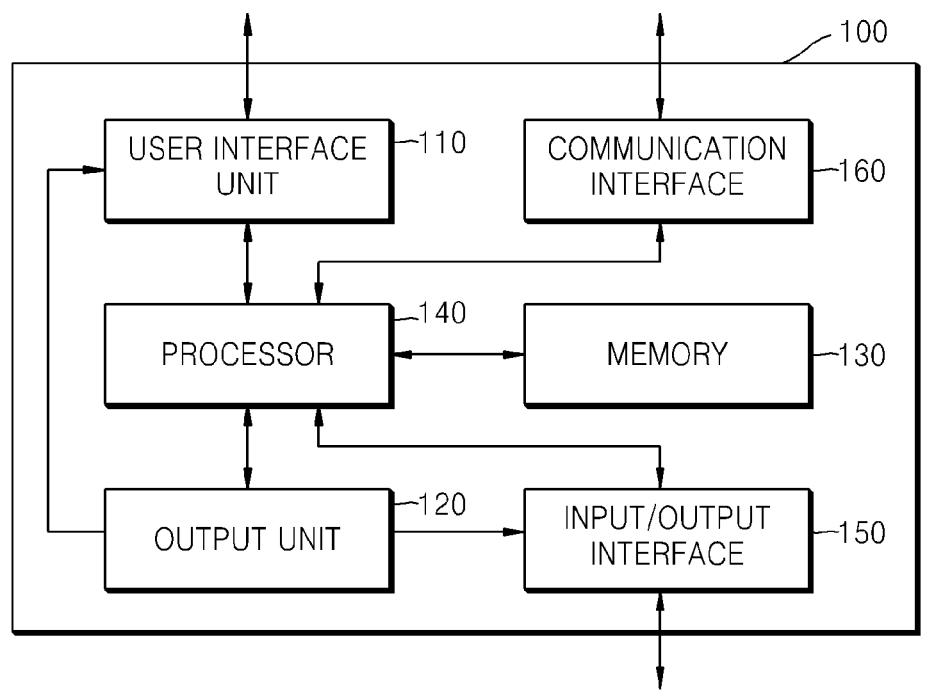
FIG. 1 is a block diagram of an embodiment of a sound source playing apparatus.

Embodiments now will be described more fully hereinafter with reference to the accompanying drawings, in which embodiments are shown. These embodiments may, however, be embodied in many different forms and should not be construed as limited to the embodiments set forth herein. Rather, these embodiments are provided so that this disclosure will be thorough and complete, and will fully convey the scope of the disclosure to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used hereinto describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the disclosure.

All methods described herein can be performed in a suitable order unless otherwise indicated herein or otherwise clearly contradicted by context. The use of any and all examples, or exemplary language (e.g., "such as"), is intended merely to better illustrate the disclosure and does not pose a limitation on the scope thereof unless otherwise claimed. No language in the specification should be construed as indicating any non-claimed element as essential to the practice of the embodiments as used herein.

Hereinafter, the embodiments will be described in detail with reference to the accompanying drawings.

FIG. 1 is a block diagram of a sound source playing apparatus 100. Referring to FIG. 1, the sound source playing apparatus 100 includes a user interface unit 110, an output unit 120, a memory 130, a processor 140, an input/output interface 150, and a communication interface 160. In the following description of the embodiment of a sound source playing apparatus 100 of FIG. 1, constituent elements related to the sound source playing apparatus 100 will be described. Accordingly, it would be understood by those skilled in the art related to the sound source playing apparatus 100 that other general constituent elements may be included in addition to the constituent elements described with respect to FIG. 1.

The sound source playing apparatus 100 is an apparatus that may play a sound, also referred throughout as a sound source, or output a signal to play the sound source. In one exemplary embodiment the sound source playing apparatus 100 may be portable, i.e., able to be easily carried by a user. Being able to be carried signifies that the sound source playing apparatus 100 may be held by a hand or carried without difficulty. Also, the sound source playing apparatus 100 signifies an apparatus that generates sound that a user may hear, from data stored in form of a digital or analog signal, or outputs a signal to generate sound that the user may hear.

The sound source playing apparatus 100 may come in various forms, for example, mobile phones, personal digital assistants ("PDAs"), MPEG audio layer-3 ("MP3") players, compact disc ("CD") players, or portable media players. The sound source playing apparatus 100 of the embodiment of the present invention is not limited thereto and may include any apparatuses capable of generating sound that the user may hear or outputting a signal to generate sound that the user may hear.

The sound source playing apparatus 100 is equipped with a function to select a method of compensating an output signal, store a selected compensation method, and compensate a sound source signal output by a stored compensation method, which is added to an apparatus that plays sound that the user may hear or outputs a signal indicating sound that the user may hear. The compensation of the output signal is performed with respect to the personalized hearing characteristic of a user of the sound source playing apparatus 100. The hearing characteristic of a user signifies a level of hearing ability of a user with respect to sound for each frequency range and may be determined by a hearing test.

The hearing ability signifies an ability to hear sound by the user, a key component of which being the user's ears, while the hearing test is a test to measure a level of hearing ability via the ears. That is, the sound source playing apparatus 100 plays a test sound corresponding to a sound source with a function to measure a level of hearing ability by the ears or outputs a test signal corresponding to a sound source signal to play the sound source with a function to measure a level of hearing ability by the ears, and determines the hearing characteristic of a user by reflecting the reaction of the user to the test sound played by the sound source playing apparatus 100 or the test sound played by the output test signal.

The sound source signal is a signal which generates sound. That is, the output unit 120 outputs a signal to generate sound. The signal to generate sound is a waveform having an amplitude, a frequency, and a phase. The signal is amplified by an amplifier to generate sound, or transmitted to, for example, earphones. As used herein, earphones are another sort of sound source playing apparatus connected to the sound source playing apparatus 100, via the input/output interface 150 to generate sound. The sound source playing apparatus 100 may determine the hearing characteristic of a user and compensate the signal output from the sound source playing apparatus 100 using a result of the determination.

When a user of the sound source playing apparatus 100 has a low level of hearing ability for any frequency band, hearing satisfaction with the sound source signal output from the sound source playing apparatus 100 may not be high. Thus, the hearing satisfaction of a user may be improved by compensating the sound source signal output from the sound source playing apparatus 100 via the compensation method according to the hearing characteristic of a user of the sound source playing apparatus 100, that is, the user. More specifically, the sound source playing apparatus 100 may tailor its output sound source signal according to the individual hearing deficits of the user, and furthermore the sound source playing apparatus 100 may determine what the individual hearing deficits are according to user input.

The sound source playing apparatus 100 will be described by referring to the constituent elements of the sound source playing apparatus 100 of FIG. 1.

In the present embodiment, the user interface unit 110 displays a plurality of areas indicating a variety of compensation methods for the signal output from the sound source playing apparatus 100 and obtains an input signal from the user that corresponds to at least one of the displayed areas. For example, the user interface unit 110 includes all input/output devices such as a display panel, a mouse, a keyboard, an input button, a touch screen, a liquid crystal display ("LCD") screen, a monitor, and a speaker provided in the sound source playing apparatus 100. Although a user interface including a plurality of areas is described in detail, alternative embodiments include configurations wherein only a single area is displayed at a time, but a plurality of areas may be displayed in temporal sequence. Alternative embodiments may also include configurations wherein more than one, but fewer than all areas are displayed at once.

The user interface unit 110 displays a plurality of areas corresponding to the respective compensation methods for the signal output from the sound source playing apparatus 100. Each of the areas indicates a compensation method using an amplification gain to a plurality of frequency bands. In the present embodiment, each of the areas corresponds to an amplification gain in different frequency bands.

FIGS. 2A-D illustrates a variety of areas displayed on the user interface unit 110. Referring to FIGS. 2A-D, the areas may be displayed in a display area of the user interface unit 110 in the form of a user interface. The display area signifies an area to which information is output, e.g., display output information. An input signal from a user may be obtained from the display area using a touch function. In one embodiment, the display may be a display panel having a touch function provided in the user interface unit 110. However, alternative embodiments include alternative output and input methods.

Figure 2:
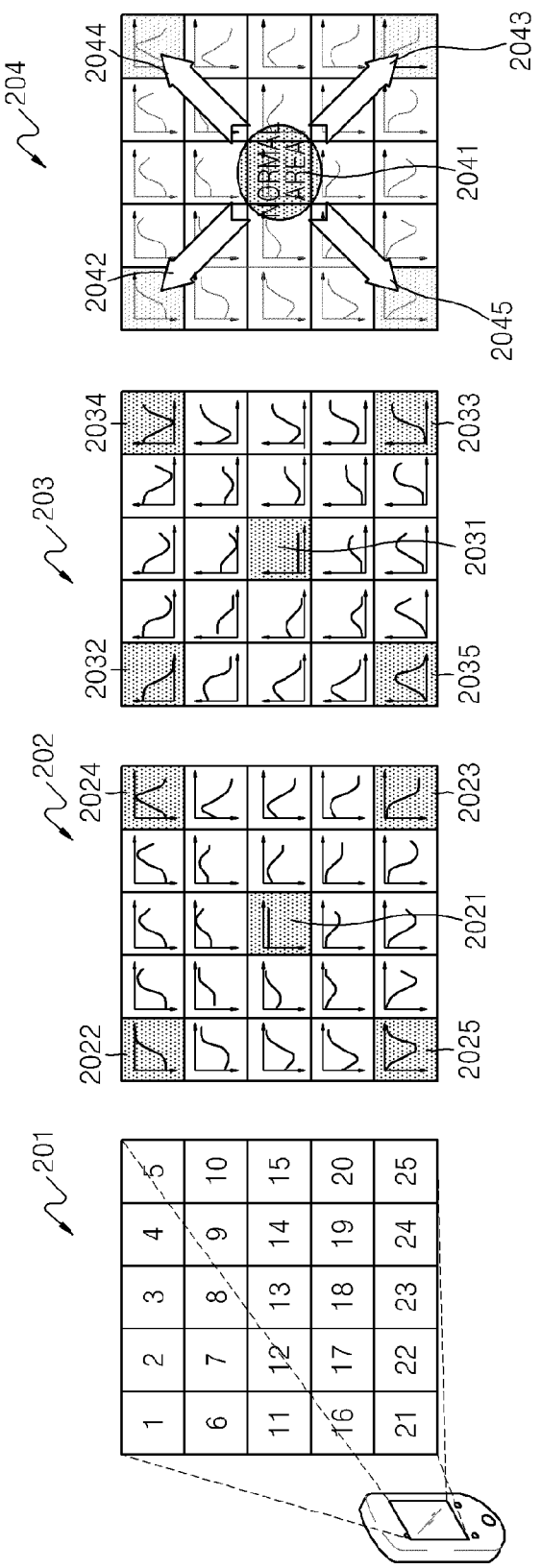
FIGS. 2A-D illustrate an embodiment of a variety of areas displayed on a user interface unit.

Referring to FIG. 2A, a display area 201 may be subdivided into a number of smaller display areas, e.g., the areas displaying numbers 1-25 in FIG. 2A. The smaller display areas may be obtained by dividing the display area of the user interface unit 110 into a plurality of sub-areas and assigning numbers to the respective sub-areas. Each sub-area indicates an amplification gain for each of a plurality of frequency bands and an amplification gain to each frequency band is mapped corresponding to information on the position of the sub-area. The number used to specify each sub-area is merely an example and a variety of methods, for example, letters or signs, may be used. The sound source playing apparatus 100 may receive an input signal when a user touches one of the sub-areas of the number display area 201 of the user interface unit 110, store an amplification gain for a frequency band corresponding to the touched sub-area, and output a signal compensated using the stored amplification gain for a frequency band.

Referring to FIG. 2B, hearing impairment pattern display area 202 displaying a variety of hearing impairment patterns may be obtained by dividing the display area of the user interface unit 110 into a plurality of sub-areas and assigning hearing impairment pattern graphs to the respective sub-areas. The hearing impairment pattern signifies a level of hearing impairment of a user for a plurality of frequency bands in the form of a graph. In each graph of the hearing impairment pattern display area 202, the x-axis denotes a frequency (Hz) and the y-axis denotes a level of hearing impairment (dB).

The graphs indicating the hearing impairment patterns may include a low frequency band hearing impairment graph 2022 indicating that hearing ability at a low frequency band is relatively poor, a high frequency band hearing impairment graph 2023 indicating that hearing ability at a high frequency band is relatively poor, a high and low frequency band hearing impairment graph 2024 indicating that hearing ability at high and low frequency bands is relatively poor, and an intermediate frequency band hearing impairment graph 2025 indicating that hearing ability at an intermediate frequency band is relatively poor, compared to a normal graph 2021 indicating that a level of hearing ability t a plurality of frequency bands is good. As discussed above, a variety of types of hearing impairment pattern graphs may exist and thus the hearing impairment pattern display area 202 may display the variety of types of hearing impairment pattern graphs.

The user touches any one of the sub-areas of the hearing impairment pattern display area 202 of the user interface unit 110. The output unit 120 outputs a signal to which an amplification gain for each frequency band is applied according to a compensation method corresponding to the touched sub-area.

For example, when a user touches the sub-area where the high frequency band hearing impairment graph 2023 is displayed, the output unit 120 may output a signal to which an amplification gain for a high frequency band is increased. That is, according to the high frequency hearing impairment pattern graph, when a level of hearing impairment is between about −30 dB to about −40 dB at a frequency band of about 3000 Hz to about 7000 Hz, the output unit 120 may output a signal to which an amplification gain of about 30 dB to about 40 dB is applied at the frequency band of about 3000 Hz to about 7000 Hz.

Referring to FIG. 2C, an amplification gain pattern display area 203 for displaying amplification gains to frequency bands in a graphical form, may be obtained by dividing the display area of the user interface unit 110 into a plurality of sub-areas and assigning amplification gain pattern graphs to the respective sub-areas. The amplification gain for a frequency band signifies a compensation gain using the hearing impairment pattern graphs described in the hearing impairment pattern display area 202.

For example, the graphs indicating the amplification gains may include a low frequency band amplification gain graph 2032 to add an amplification gain to a low frequency band, a high frequency band amplification gain graph 2033 to add an amplification gain to a high frequency band, a high and low frequency band amplification gain graph 2034 to add amplification gains to high and low frequency bands, and an intermediate frequency band amplification gain graph 2035 to add an amplification gain for an intermediate frequency band, compared to a normal graph 2031 indicating that a level of an amplification gain to a plurality of frequency bands is constant. As described above, a variety of types of amplification gain pattern graphs may exist and thus the amplification gain pattern display area 203 may display a variety of types of an amplification gain for each frequency band.

Similar to the previous embodiments, the user touches any one of the sub-areas of the amplification gain pattern display area 203 of the user interface unit 110 in order to input which type of amplification gain pattern is desired. The output unit 120 outputs a signal to which an amplification gain for each frequency band is applied according to a compensation method corresponding to the touched sub-area.

Referring to FIG. 2D, a hearing characteristic display area 204 displaying hearing impairment patterns may be obtained by dividing the display area of the user interface unit 110 into a plurality of sub-areas and assigning the hearing impairment patterns to the respective sub-areas. That is, the characteristics of the divided sub-areas are indicated by using a circle or an arrow that indicates, for example, a normal area 2041, a low frequency band hearing impairment area 2042, a high frequency band hearing impairment area 2043, a high and low frequency band hearing impairment area 2044, and an intermediate frequency band hearing impairment area 2045. The arrow denotes that a level of hearing impairment increases with distance from the normal area, that is, the patterns increase in amplitude with distance from the normal area in a direction along the arrow. A user may select a compensation method using an amplification gain for each frequency band that the user desires by selecting any one of the sub-areas according to the hearing characteristic of the user with reference to the hearing characteristic display area 204.

It can be seen that the above-described display areas of the user interface unit 110 are mere examples that may be displayed on the sound source playing apparatus 100 and thus the display area may be displayed in a variety of forms. Also, although the display area of FIGS. 2A-D are divided into 25 sub-areas, the display area is not limited thereto and may be divided into, for example, three (3), five (5), nine (9) or more sub-areas, in a variety of methods.

For example, when an amplification gain for each frequency band according to the hearing impairment patterns is displayed in each of the sub-areas displayed on the display area, the user interface unit 110 may display the display area by dividing the display area into three (3) sub-areas of a normal area, a low frequency band hearing impairment area, and a high frequency band hearing impairment area, or five (5) sub-areas of a normal area, a low frequency band hearing impairment area, a high frequency band hearing impairment area, a high and low frequency band hearing impairment area, and an intermediate frequency band hearing impairment area. Those who are skilled in the art related to the sound source playing apparatus 100 would know that the three (3) sub-areas, five (5) sub-areas, and twenty five (25) sub-areas are mere examples and that the display area may be divided into a variety of numbers of the sub-areas and the divided sub-areas may be displayed in a variety of methods. However, the higher the number of sub-areas, the finer the user control of the particular frequency bandwidth which receives amplification gain and/or the finer the user control of the amplification gain in a particular frequency bandwidth.

Referring back to FIG. 1, the user interface unit 110 obtains an input signal generated as a user touches at least one of the displayed sub-areas (again, a user touch input is only one embodiment of a user input method). The user inputs a signal to select one of the sub-areas displayed in the sound source playing apparatus 100 by touching at least one of the sub-areas displayed in the display area of the user interface unit 110. The touch may include all kinds of touches using the body part of the user, for example, a finger, or a touch member, for example, a touch pen.

The user selects at least one of the sub-areas displayed on the user interface unit 110 using his/her body part or a touch member. The user interface unit 110 obtains an input signal from the user. The processor 140 extracts the positional information of the touched sub-area according to the obtained input signal, stores a compensation method corresponding to the position information in the memory 130, and outputs a compensated test signal through the output unit 120 corresponding to the stored compensation method. The compensation method may be a signal to which an amplification gain for the frequency bands indicated by the touched sub-area is applied.

The user interface unit 110 obtains a reaction of the user to the test signal output through the output unit 120. The reaction of the user includes all actions such as responses or actions of the user to test sound played according to the output test signal. The reaction of the user may be identified based on the preference of the user. That is, the user may desire to apply the compensation method applied to the output test signal because the user has a high preference for the test sound played according to the output test signal, or desire to hear other test sounds played according to other test signals to which different compensation methods are applied because the user has a low preference for the test sound played according to the output test signal.

The user interface unit 110 may obtain a response to the preference of the user. For example, when the test sound played according to the output test signal is not preferred by the user, that is, the user desires to hear other test sounds played according to other test signals to which different compensation methods are applied, the user may touch other sub-areas than the previously touched sub-area. The user interface unit 110 may obtain a response that the user touches another sub-area that was not previously touched.

That is, the user interface unit 110 obtains a signal corresponding to touching a second sub-area that is different from a first sub-area that was touched by the user. The user may move a touch state from the first sub-area to the second sub-area without discontinuing the touch state of the display area of the user interface unit 110. The user may touch the second sub-area that is different from the touched first sub-area by dragging a cursor indicating the touch position, the body part of the user, or a touch member from the first sub-area to the second sub-area of the user interface unit 110, although alternative embodiments include alternative input methods.

When the touch state is discontinued, that is, no input signal to the touched sub-area is obtained by the user interface unit 110, the sound source playing apparatus 100 may set to determine the last touched sub-area as the sub-area selected by the user. When the touch state of the user is discontinued at any one of the sub-areas, the processor 140 may store a compensation method corresponding to the sub-area where the touch state is discontinued, in the memory 130, and compensate the sound source signal output from the sound source playing apparatus 100 using the stored compensation method.

Thus, the user interface unit 110 may obtain a signal indicating that the touch state is moved from the first sub-area to the second sub-area during which the touch state of the display area is not discontinued, so as to obtain a response that the user desires to hear the test signal to which the compensation method corresponding to the second sub-area is applied.

The user interface unit 110 obtains an input signal to the second sub-area. The processor 140 extracts the positional information of the obtained signal and outputs the test signal compensated by the compensation method mapped corresponding to the extracted positional information, via the output unit 120. The user interface unit 110 again obtains the response of the user to the output test signal. The sound source playing apparatus 100 may employ the compensation method preferred by the user by repeating the above operation until the test sound preferred by the user is played, after which the touch state may be discontinued.

When the preference of the user for the output test signal is high so that the user may desire to use the compensation method applied to the output test signal for the sound source playing apparatus 100, the user discontinues the touch state of the sub-area from which the test sound compensated by the preferred compensation method. That is, the user touches any one of the sub-areas displayed in the display area and, when the preference for the signal output corresponding to the touched sub-area is high, removes the body part of the user or the touch member from the touched sub-area to apply the compensation method corresponding to the touched sub-area to the sound source playing apparatus 100. The user interface unit 110 may obtain a response that the touch state of the touched sub-area is discontinued.

That is, when no input signal is obtained through the user interface unit 110 for a pre-set time period, the processor 140 may determine that the touch state of the user interface unit 110 is discontinued and store the compensation method corresponding to the sub-area that was touched last before the touch state was discontinued, in the memory 130, to be applied to the sound source playing apparatus 100. The pre-set time period may be variously set according to a use environment. For example, 50 msec may be set to be the pre-set time period. That is, when no input signal to the display area is obtained through the user interface unit 110 for about 50 msec, the compensation method mapped corresponding to the positional information of the sub-area touched last before the touch state was discontinued may be stored in the memory 130 to be applied to the sound source playing apparatus 100.

Also, the user interface unit 110 may perform a method of testing the hearing ability of the user and display a result of the test, that is, the hearing characteristic of the user. For example, the user may recognize information on the hearing characteristic of the user by displaying a message "The amplification gain of about 30 dB to 40 dB is set to a high frequency band between about 3000 Hz to about 4000 Hz." or a hearing impairment pattern graph such as the hearing impairment pattern display area 202 of FIGS. 2A-D or a graph about the amplification gains to a plurality of frequency bands such as the amplification gain pattern display area 203 of FIGS. 2A-D.

Thus, with respect to the plurality of sub-areas displayed in the user interface unit 110, the user may hear test sounds played according to the test signal compensated in a variety of compensation methods using a touch function. Also, when the user does not prefer the sound played according to the test signal compensated by the compensation method corresponding to one of the sub-areas, the user may move, for example, drag, the cursor, the body part of the user or the touch member to another sub-area so as to easily hear test sound played according to a test signal compensated by a different compensation method. The sound source signal output from the sound source playing apparatus 100 may be easily compensated using the user interface unit 110 having a touch function provided in the sound source playing apparatus 100. Also, a hearing ability test of the user may be performed through a simple operation for a short time. The sound source signal output from the sound source playing apparatus 100 may be compensated by directly applying a result of the hearing ability result to the sound source playing apparatus 100.

The output unit 120 outputs the test signal compensated by the compensation method corresponding to a sub-area with respect to at least one of the sub-areas displayed on the user interface unit 110. In the present embodiment, the test signal is a sentence including a plurality of frequency bands and the sentence includes at least one sound of a word. The sound of a word includes at least one syllable. According to the number of syllables, there is a monosyllable consisting of a single syllable, a disyllable consisting of two syllables, and a trisyllable consisting of three syllables. The sound of a word including a plurality of syllables may be represented in the same manner.

The term "syllable" is a part of the terminology of phonetics, meaning the smallest unit of pronunciation. The syllable may consist of a consonant—a vowel—a consonant, for example, "h-i-m", a consonant—a vowel, for example, "g-o", or a vowel, for example, "a". The syllable refers to the smallest unit in pronunciation and a single syllable consists of at least one phoneme. The term phoneme is a unit of sound distinguishing the meaning of a language. That is, the term phoneme refers to the smallest segmental unit of sound employed to form meaningful contrasts between utterances in a language.

Figure 3:
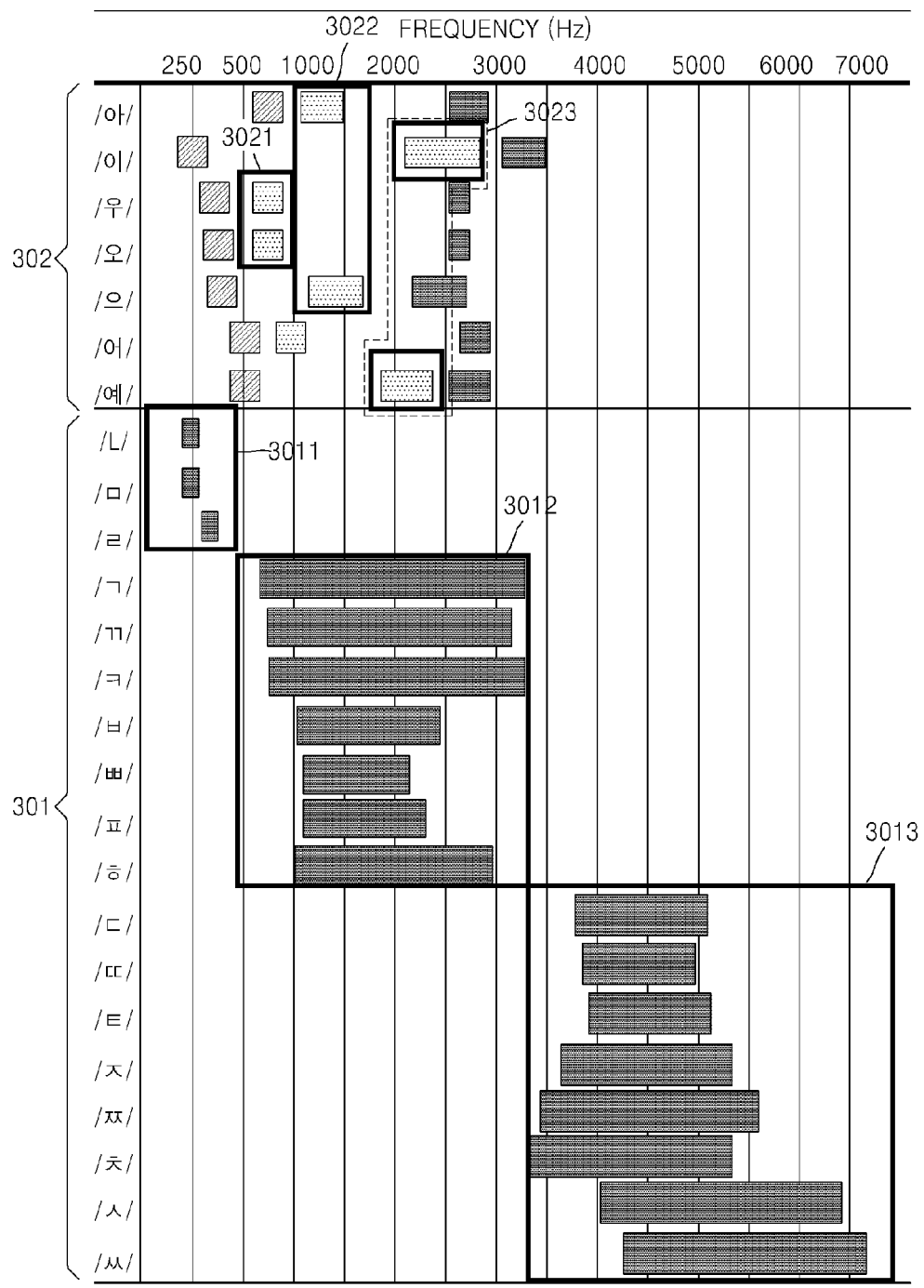
FIG. 3 illustrates the frequency characteristics of Korean phonemes.

FIG. 3 illustrates the frequency characteristics of Korean phonemes. Referring to FIG. 3, the phonemes of the Korean language are classified into vowels and consonants and frequency ranges forming each of the consonants and vowels are illustrated. Also, the consonants and vowels are divided into a plurality of groups according to the frequency ranges.

Referring to FIG. 3, a consonant list 301 indicates a frequency range for consonants and the consonants are classified into three groups according to their respective frequency ranges. A first group 3011 includes consonants belonging to a frequency range of about 250 Hz to about 500 Hz. A second group 3012 includes consonants belonging to a frequency range of about 650 Hz to about 3000 Hz. A third group 3013 includes consonants belonging to a frequency range of about 3000 Hz to about 7000 Hz.

The consonants of the first group 3011 include /ㄴ/, /ㅁ/, and /ㄹ/. The consonants of the second group 3012 include /ㄹ/, /ㄲ/, /ㅋ/, /ㅂ/, /ㅃ/, /ㅍ/, and /ㅎ/. The consonants of the third group 3013 include /ㄷ/, /ㄸ/, /ㅌ/, /ㅈ/, /ㅉ/, /ㅊ/, /ㅅ/, and /ㅆ/.

Also, a vowel list 302 indicates a frequency range for vowels. Referring to the vowel list 302, a vowel includes three formant frequencies. The formant frequency indicates peak frequencies showing relatively high energies in a frequency spectrum obtained by integrating the amplitude (dB) of sound for a vowel in time with respect to a frequency axis. Referring to the vowel list 302, the three formant frequencies forming a single vowel may be indicated by a first formant, a second formant, and a third formant in sequence from a low frequency band. As shown in the vowel list 302, since the frequency bands of the first and third formants are similar in most vowels, vowels may be classified into three groups based on the second formant band. According to this classification, a first vowel-group 3021 indicates vowels having the second formant belonging to a frequency range between about 600 Hz to about 800 Hz, a second vowel-group 3022 indicates vowels having the second formant belonging to a frequency range between about 1000 Hz to about 1300 Hz, and a third vowel-group 3023 indicates vowels having the second formant belonging to a frequency range between about 2000 Hz to about 3000 Hz.

The vowels of the first vowel-group 3021 include /우/ and /오/. The vowels of the second vowel-group 3022 include /아/ and /으/. The vowels of the third vowel-group 3023 include /이/ and /에/.

Referring to FIG. 3, a sentence is formed of at least one syllable and a syllable is formed of at least one phoneme. The processor 140 generates a test signal indicating a sentence including a plurality of frequency bands compensated in a compensation method corresponding to at least one of a plurality of areas and outputs the test signal from the output unit 120. The test signal indicating a sentence including a plurality of frequency bands may be stored in the memory 130. That is, the memory 130 stores the test signal indicating a sentence including a plurality of frequency bands, or test signals compensated by a variety of methods for compensating the test signal. The processor 140 may read out the test signal from the memory 130 and test the hearing characteristics of a user.

In the sentence including a plurality of frequency bands, the frequency bands correspond to an audible frequency range. The audible frequency range is a frequency range of sound waves that may be sensed as sound by the ears of a user, signifying a frequency range between about 15 Hz to about 20 KHz. However, the sound source playing apparatus 100 may not compensate a sound source signal output from the sound source playing apparatus 100 for the entire audible frequency range.

The sound source playing apparatus 100 stores in the memory 130 amplification gains to frequency bands corresponding to the various compensation methods indicating a plurality of areas displayed on the user interface unit 110. The output unit 120 outputs a test signal indicating a compensated sentence using a compensation method mapped to one of the areas with respect to the sentence stored in the memory 130. When the user touches another area via the user interface unit 110, another test signal indicating a compensated sentence by another compensation method mapped corresponding to the other area with respect to the same sentence is output.

For example, when the hearing characteristic of a user is to be tested with respect to a frequency range within the audible frequency range, the frequency range to be tested is classified into a plurality of frequency bands. A sentence formed of the phonemes with reference to the phonemes included in a group indicating each frequency band with respect to the classified frequency bands is stored in the memory 130. That is, the sound source playing apparatus 100 classifies a frequency band from about 20 Hz to 7,000 Hz into a plurality of frequency bands, and stores a sentence formed of the phonemes including all of the classified bands, in the memory 130. The sentence is formed by each of the classified bands with the phonemes belonging to each band. Thus, the sentence stored in the memory 130 is configured to include phonemes corresponding to all of the frequency bands. The output unit 120 outputs a test signal in which a compensation method that is mapped corresponding to a touched area according to an input signal acquired from the user interface unit 110, is applied to the sentence. When the user moves the touched area through the user interface unit 110, the output unit 120 again outputs another test signal in which another compensation method mapped corresponding to the moved and touched area is applied to the sentence.

For example, assuming that a sentence "This sentence is for the hearing test" is configured to include the above-mentioned frequency bands, the sentence "This sentence is for the hearing test" is stored in the memory 130. When the user touches the first area via the user interface unit 110, the processor 140 extracts the positional information of the first area, and outputs the sentence "This sentence is for the hearing test" that is compensated by a compensation method mapped corresponding to the extracted positional information, through the output unit 120. Embodiments include configurations wherein alternative sentences are used, specifically where the sentence is specifically selected for the range of frequencies it contains.

When a level of the user's audibility of the sentence played according to a test signal output corresponding to the first area is not high, that is, the preference of the user for the sentence played according to a test signal output corresponding to the first area is not high, the user touches a second area that is different from the touched first area. The processor 140 extracts the positional information of the second area and outputs the sentence "This sentence is for the hearing test" that is compensated by a compensation method mapped corresponding to the extracted positional information, through the output unit 120.

Thus, the user may hear sentences to which a variety of compensation methods are applied and stops a touch state with respect to an area corresponding to the sentence that is determined to have the highest audibility level. Thus, the compensation method that is applied to the sentence having the highest audibility level may be used for the sound source playing apparatus 100.

The hearing characteristic of a user may be determined using the sound of a word, that is, syllables and sentences familiar to the user, rather than using a pure tone. Also, the user's preference over the sound of a word may be more accurately determined before a compensation method is actually applied to the sound of a word. Thus, the user's preference over the compensation method to compensate the sound source signal output from the sound source playing apparatus 100 is more reliable achieved than that of a tone-only system.

Figure 4:
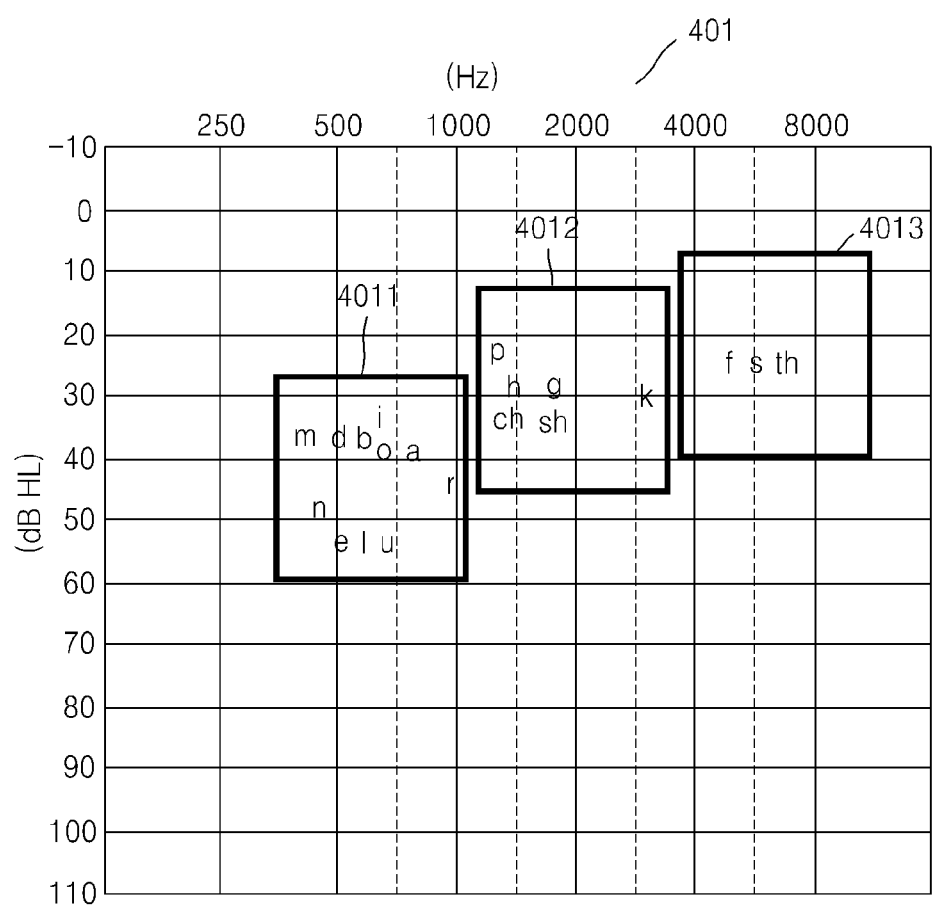
FIG. 4 illustrates the frequency characteristics of English phonemes.

The frequency characteristics of phonemes may be applied not only to the Korean language but also to other languages. FIG. 4 illustrates the frequency characteristics of English phonemes. The English phonemes are classified into a plurality of groups according to the range of frequencies displayed thereby.

A phoneme list 401 shows a frequency range for phonemes and the phonemes are classified into three groups according to their respective frequency range. A first group 4011 denotes phonemes belonging to a frequency range from about 300 Hz to about 1200 Hz. A second group 4012 denotes phonemes belonging to a frequency range from about 1200 Hz to about 4000 Hz. A third group 4013 denotes phonemes belonging to a frequency range from about 4000 Hz to about 8000 Hz.

The first group 4011 includes phonemes such as /m/, /d/, /b/, /l/, /o/, /a/, /n/, /e/, /I/, /u/, and /r/. The second group 4012 includes phonemes such as /p/, /h/, /g/, /k/, /ch/, and /sh/. The third group 4013 includes phonemes such as /f/, /s/, and /th/. Thus, referring to the frequency characteristic of the Korean and English phonemes of FIGS. 3 and 4, the hearing characteristic of a user may be determined according to a result of a hearing test of the user for a variety of languages.

Referring back to FIG. 1, the output unit 120 outputs a sound source signal compensated using a compensation method corresponding to a selected one of the areas on the display. Again, alternative embodiments include configurations wherein the compensation method may be selected using various input and output methods. That is, the compensation method that is determined by the user to have the highest preference is stored in the memory 130. The output unit 120 may output a sound source signal compensated using the compensation method stored in the memory 130.

The test signal output from the output unit 120 is played to stimulate the hearing organ of the user so that the user may hear sound. The output unit 120 may output an audio signal to generate sound. The user interface unit 110, for example, a speaker, may generate sound directly from the sound source playing apparatus 100 using an output audio signal from the output unit 120. Also, the output unit 120 may output an audio signal to generate sound. The input/output interface 150 transmits the audio signal to another sound source playing apparatus, for example, earphones, Bluetooth earphones, and/or speakers, connected to the sound source playing apparatus 100 so that another sound source playing apparatus (not shown) may generate sound. Accordingly, in one embodiment sound indicated by the output signal may be generated by another sound source playing apparatus.

Thus, the sound source playing apparatus 100 directly generates sound via the user interface unit 110 or another sound source playing apparatus connected to the sound source playing apparatus 100 in order to generate sound. The processor 140 may generate a test signal to be output from the output unit 120 based on the data read from the memory 130. The output unit 120 may be included in the processor 140, e.g., as part of an integrated chip, or presented in a form of an independent chip.

The memory 130 stores a compensation method mapped corresponding to the positional information of the areas displayed on the display area of the user interface unit 110, at least one sound of a word to output a test signal, and a compensation method corresponding to the selected one of the areas. The memory 130 is a storage medium, and those skilled in the art to which the sound source playing apparatus 100 for testing hearing ability pertains would understand that embodiments of the memory 130 could include hard disk drives ("HDDs"), read only memories ("ROMs"), random access memories ("RAMs"), flash memories, and memory cards.

As described above, the memory 130 stores a variety of compensation methods mapped corresponding to the positional information of the areas displayed on the display area of the user interface unit 110. Accordingly, the memory 130 may store amplification gains to a plurality of frequency bands, which is one embodiment of the compensation methods. The processor 140 extracts the positional information of the area touched by the user according to the signal obtained via the user interface unit 110, and reads out the amplification gain for each frequency band corresponding to the extracted positional information. The output unit 120 outputs a test signal to which the read amplification gain for each frequency band is applied.

Also, the memory 130 stores at least one sound of a word to output a test signal. The sound of a word may be a sentence configured to include all of the frequency bands to test the hearing characteristic of the user. The at least one sound of a word to test the hearing characteristic of the user is stored in the memory 130 and may improve reliability of a test by excluding prejudice of the user using different sounds of a word when the user performs the test several times.

The memory 130 stores a compensation method corresponding to the selected one of the areas indicating a variety of compensation methods. When an input signal is not obtained after a pre-set time via the user interface unit 110, the processor 140 may store an amplification gain for each frequency band corresponding to the compensation method mapped corresponding to the touched area prior to the touch state being discontinued, to apply the amplification gain to the sound source signal output from the sound source playing apparatus 100. The storing of the amplification gain to be used for the sound source playing apparatus 100 may be achieved by playing the sound source via the sound source playing apparatus 100 by reflecting the amplification gain for each frequency band to a codec applied to the sound source playing apparatus 100.

That is, in an embodiment wherein the sound source playing apparatus 100 is a cellular phone, the amplification gain for each frequency band stored in the memory 130 to be applied to the playing of the sound source is applied to all sound source signals output through the cellular phone. Accordingly, when the user makes a call using the cellular phone that is the sound source playing apparatus 100, or listens to music, a level of audibility of the played sound source increases by hearing the sound which reflects the hearing characteristic of a user and the sound generated as the sound source signal to which the amplification gain for each frequency band selected by the user is applied.

The amplification gain for each frequency band to be used for playing of a sound source may be selected through the user interface unit 110. As described above, although the processor 140 may store the amplification gain for each frequency band mapped corresponding to the last touched area prior to the touch state being discontinued, to be applied to the sound source playing apparatus 100 when an input signal is not obtained for a pre-set time through the user interface unit 110, the embodiment of the present invention is not limited thereto. That is, the user may select an amplification gain for each frequency band through the user interface unit 110 or an amplification gain for each frequency band to be applied to the sound source playing apparatus 100 by another method. The memory 130 may store the selected amplification gain for each frequency band and be applied to the playing of a sound source through the sound source playing apparatus 100.

The processor 140 controls the overall function of the sound source playing apparatus 100. The processor 140 controls the user interface unit 110, the output unit 120, the memory 130, the input/output interface 150, and the communication interface 160. The processor 140 extracts the positional information of the touched area according to the signal obtained through the user interface unit 110, reads out the compensation method mapped corresponding to the extracted positional information from the memory 130, and outputs the test signal compensated using the read compensation method through the output unit 120. The processor 140, referring to a response to the test signal output from the user interface unit 110, may store the compensation method in the memory 130 and apply the selected compensation method to the sound source playing apparatus 100.

The processor 140 selects any one of the areas based on a user's response to the test signal output from the output unit 120 and compensates a sound source signal output from the sound source playing apparatus 100 using the compensation method corresponding to the selected area. The processor 140 may compensate a signal to play a sound source by increasing a gain for a frequency range in which the user has difficulty hearing by reflecting the hearing characteristic of the user. The compensated signal may be output through the output unit 120 and heard by the user. Also, the processor 140 operates an algorithm to play a sound source by reflecting the compensation method according to the hearing characteristic of the user. The algorithm includes all methods used for conversion between an electric signal and sound. A code may be included that corresponds to the algorithm. The memory 130 may store the operated algorithm. The sound source playing apparatus 100 may read out the stored algorithm and use the read algorithm when the sound source is played.

That is, the processor 140 stores the algorithm corresponding to the compensation method which reflects the hearing characteristic of the user in the memory 130, and plays the sound source by applying the compensated algorithm to all sound sources played through the sound source playing apparatus 100.

In the present embodiment the hearing test is performed using the sound source playing apparatus 100 and the test result may be reflected directly to the sound source playing apparatus 100. Accordingly, the hearing test is performed in the sound source playing apparatus 100 that is portable and the test result may be reflected in all sound sources subsequently played through the sound source playing apparatus 100, thereby directly reflecting the test result.

Also, the signal output from the output unit 120 is played as sound via the user interface unit 110 or the input/output interface 150. The sound source playing apparatus 100 of FIG. 1 may reduce a measurement time, compared to a method of measuring a user's response using a pure tone because the hearing of a user is tested using at least one syllable, which provides a more realistic and easily identifiable testing method. Also, because the amount of a pure tone is not constant, the deterioration of a test may be prevented.

Although a Speech Audiometry hearing test may be performed using the sound of a word that is familiar to the user, the Speech Audiometry hearing test takes lots of test time and requires the user to inconveniently visit a place where the test is performed. A fast and reliable test result may be obtained by performing a test using the sound of a word using the sound source playing apparatus 100. Accordingly, the compensation method obtained by reflecting the hearing characteristic of the user may be applied to the sound source playing apparatus 100.

The input/output interface 150 has an interface function to connect the sound source playing apparatus 100 to the additional sound source playing apparatus so that the signal output from the output unit 120 may be played by the additional sound source playing apparatus. For example, the input/output interface 150 may be head set jacks or USB modules provided in cellular phones and MP3 players corresponding to the sound source playing apparatus 100.

When hearing ability is to be tested, since it is typical practice to perform a hearing test to both of the right ear and the left ear, an apparatus to play another sound source such as earphones may be used to simultaneously perform a hearing test to both ears, i.e., via a stereo hearing test. Thus, the input/output interface 150 may function as an interface for all accessories by being connected to the sound source playing apparatus 100 and playing the signal generated by the sound source playing apparatus 100 as sound.

The communication interface 160 communicates data between the sound source playing apparatus 100 and an external apparatus. The communication interface 160 may, or may not, be present in the sound source playing apparatus 100 according to the particular environment where usage of the sound source playing apparatus 100 occurs.

In the embodiment wherein the sound source playing apparatus 100 is a cellular phone, the overall functions of the cellular phone, such as telephone calling, text message communications, and accessing the Internet, may be achieved by communicating data via the communication interface 160.

Thus, the user may determine the amplification gain for each frequency band according to the hearing characteristic established according to the result of the hearing test performed using the sound source playing apparatus 100. Also, by instantly applying the determined amplification gain for each frequency band to the sound source playing apparatus 100, the result of the hearing test may be directly used so that the user's hearing of the sound of a word may be improved.

Also, the sound source playing apparatus 100 receives an input information corresponding to the volume of sound from the user through the user interface unit 110, and tests the hearing ability of the user using the signal indicating at least one syllable from the sound volume set based on the input information. That is, the sound source playing apparatus 100 obtains an input corresponding to the sound volume information preferred by the user through the user interface unit 110 and determines the hearing characteristic of the user using the signal indicating at least one sound of a word in the sound volume set based on the input information. The term "sound volume information preferred by the user" is the most comfortable volume level that is sensed by the user. The user sets the sound volume of the sound source playing apparatus 100 using the user interface unit 110.

However, since in one embodiment the user carries the sound source playing apparatus 100 that is portable to frequently play the sound source, the level of the sound volume preferred by the user may be set in the sound source playing apparatus 100. Also, the sound source playing apparatus 100 may directly recognize the sound volume preferred by the user and perform the hearing test using the sound volume preferred by the user.

Thus, in the state in which the sound volume preferred by the user is set, the user may touch one of the areas displayed in the display area through the user interface unit 110. The processor 140 may output the test signal compensated by the compensation method mapped corresponding to the touched area through the output unit 120. Since a test is performed in which the sound volume preferred by the user is set, the reliability of the test may be further improved.

FIG. 5 is a flowchart illustrating an embodiment of a method of selecting a compensation method to compensate a sound source signal output from the sound source playing apparatus 100. Referring to FIG. 5, operations are processed according to a temporal sequence in the sound source playing apparatus 100 of FIG. 1. Thus, although additional steps may be added, the above description relating to the sound source playing apparatus 100 of FIG. 1 is applied to a method of selecting a compensation method to compensate a sound source signal output from the sound source playing apparatus 100.

In Operation 501, the user interface unit 110 displays a plurality of areas indicating a variety of compensation methods with respect to a signal output from the sound source playing apparatus 100. The areas displayed on the user interface unit 110 may be displayed in a variety of forms as illustrated in FIGS. 2A-D.

In Operation 502, the output unit 120 outputs a test signal compensated by the compensation method corresponding to an area with respect to the at least one of the plurality of areas. That is, the user inputs an input signal, e.g., via touching at least one area displayed on the user interface unit 110. The processor 140 extracts the position information of the input signal and outputs the test signal compensated by the compensation method corresponding to the extracted position information through the output unit 120.

In Operation 503, the processor 140 selects any one of the plurality of areas based on the input of the user with respect to the output test signal. When the touching by the user is discontinued or a selection signal is input by the user, the processor 140 selects an area of the areas corresponding to the ultimately touched area or which is selected by the user.

In Operation 504, the processor 140 stores the compensation method corresponding to the selected area in the memory 130. Also, the processor 140 may perform compensation on all sound source signals subsequently output through the sound source playing apparatus 100 using the compensation method stored in the memory 130.

Embodiments of the sound source playing apparatus 100 may further include one or a plurality of processors 140. Also, each of the constituent elements of the sound source playing apparatus 100 may correspond to one or a plurality of processors 140. The processor 140 may be implemented by an array of a plurality of logic gates or a combination of a general microprocessor and memories storing programs to be executed by the microprocessor.

As described above, the hearing characteristics of a user may be conveniently tested using the sound source playing apparatus 100, or a test result may be displayed by or reflected by the sound source playing apparatus 100. In an embodiment wherein a touch screen is used as an input device, buttons do not need to be inconveniently pressed several times. Since the hearing test is performed on one screen, the measurement method is simple and the measurement time is short.

Also, when the hearing test is performed once, since the test is performed on a single sound of a word, the deterioration of reliability in the test due to a study effect may be prevented. Also, since the hearing characteristics of the user are determined using a sentence, as opposed to a pure tone, and the amplification gain for each frequency band is used according thereto, there is little difference between the test result sensed by the user and the application of the sound source playing apparatus 100. Furthermore, since the touch function is used and the user interface that is familiar to the user is used, the test may be easily performed.

The invention can also be embodied as computer readable codes on a computer readable recording medium. The computer readable recording medium may be any data storage device that can store data which can be thereafter read by a computer system. Examples of the computer readable recording medium include ROMs, RAMs, CD-ROMs, magnetic tapes, floppy disks, optical data storage devices, etc. The computer readable recording medium can also be distributed over a network coupled computer system so that the computer readable code is stored and executed in a distributed fashion.

As described above, according to the one or more of the above embodiments of the present invention, the hearing ability of a user is easily tested using a touch function of a sound source playing apparatus. A method of compensating a sound source signal output from the sound source playing apparatus may be selected according to a result of the hearing test, and the selected compensation method may be stored. Also, the time for testing hearing may be shortened by testing the user's hearing ability using the touch function.

It may be understood by those skilled in the art related to the sound source playing apparatus that modifications of the sound source playing apparatus may be implemented without deviating from the above-described substantial characteristics of the sound source playing apparatus. It should be understood that the embodiments described therein should be considered in a descriptive sense only and not for purposes of limitation. Descriptions of features or aspects of the above-described sound source playing apparatus within each embodiment should typically be considered as available for other similar features or aspects in other embodiments.

What is claimed is:

1. A method of selecting a compensation method to compensate a sound source signal output from a sound source playing apparatus, the selection method comprising:
    displaying a plurality of areas respectively displaying a plurality of continued frequency bands which corresponds to amplification gain patterns that are used to compensate the sound source signal;
    obtaining an input signal which selects at least one of the plurality of areas that are displayed;
    outputting a test signal compensated by a compensation method which is corresponded to the selected area based on the input signal; and
    selecting any one of the plurality of areas based on a response of the user to the output test signal.

2. The method of claim 1, wherein each of the plurality of areas indicates a different compensation method using an amplification gain for the continued frequency band, and
    wherein the different compensation methods each use a different amplification gain for the continued frequency band.

3. The method of claim 2, wherein the compensated test signal is a sentence including at least one frequency band compensated using an amplification gain for the at least one frequency band corresponding to the at least one area.

4. The method of claim 1, further comprising compensating a sound source signal output from the sound source playing apparatus using the stored compensation method.

5. The method of claim 4, wherein the input signal comprises a touch input signal from the user corresponding to at least one of the plurality of areas that are displayed and the output of the test signal comprises outputting a test signal compensated by a compensation method corresponding to the touch input signal,
    wherein, the selecting of any one of the plurality of areas comprises selecting any one of the plurality of areas based on a response of the user to the output test signal, and
    wherein, the compensating of the sound source signal output from the sound source playing apparatus comprises performing compensation using the compensation method corresponding to the selected area.

6. The method of claim 5, wherein, the selecting of any one of the plurality of areas comprises selecting any one of the plurality of areas when a touch state of the user discontinues, and
    wherein compensation of the sound source signal output from the sound source playing apparatus is performed by the compensation method corresponding to the selected area.

7. The method of claim 1, further comprising transmitting the output test signal to an additional sound source playing apparatus connected to the sound source playing apparatus,
    wherein any one of the plurality of areas is selected based on a response of the user to hearing a test sound played according to the transmitted test signal, and
    wherein the compensation of the sound source signal output from the sound source playing apparatus is performed by the compensation method corresponding to the selected area.

8. A computer readable recording medium having recorded thereon a program for executing a method of selecting a compensation method to compensate a sound source signal output from a sound source playing apparatus, the selection method comprising:
    displaying a plurality of areas each respectively displaying a plurality of continued frequency bands which corresponds to amplification gain patterns that are used to compensate the sound source signal;
    obtaining an input signal which selects at least one of the plurality of areas;
    outputting a test signal compensated by a compensation method which is corresponded to the selected area based on the input signal; and
    selecting any one of the plurality of areas based on a response of the user to the output test signal.

9. A sound source playing apparatus which outputs a sound source signal, the sound source playing apparatus comprising:
- a user interface unit which displays a plurality of areas respectively displaying a plurality of continued frequency bands which corresponds to amplification gain patterns that are used to compensate the sound source signal;
- an output unit which outputs a test signal compensated by a compensation method corresponding to an area which is selected by a input signal; and
- a processor which selects any one of the plurality of areas based on a response of the user to the output test signal,
- wherein the user interface unit obtains the input signal which selects at least one of the plurality of areas.

10. The sound source playing apparatus of claim 9, wherein each of the plurality of areas corresponds to a different compensation method using an amplification gain for each of the continued frequency bands,
- wherein the different compensation methods each use a different amplification gain for the continued frequency bands.

11. The sound source playing apparatus of claim 10, wherein the compensated test signal is a sentence including at least one frequency band compensated using an amplification gain for the at least one frequency band corresponding to the at least one area.

12. The sound source playing apparatus of claim 9, wherein the processor compensates a sound source signal output from the sound source playing apparatus using the stored compensation method, and
wherein the output unit outputs the compensated sound source signal.

13. The sound source playing apparatus of claim 9, wherein the input signal comprises a touch input signal from the user corresponding to at least one of the plurality of areas,
- wherein the output unit outputs a test signal compensated by a compensation method corresponding to the touch input signal, and
- wherein the processor selects any one of the plurality of areas based on a response of the user to the output test signal, and performs compensation using the compensation method corresponding to the selected area.

14. The sound source playing apparatus of claim 13, wherein, when a touch state of the user discontinues for any one of the plurality of areas, the processor selects the area for which touch state is discontinued and compensates the output test signal using the compensation method corresponding to the area where the touch state was discontinued.

15. The sound source playing apparatus of claim 9, further comprising an input/output interface which transmits the output test signal to an additional sound source playing apparatus connected to the sound source playing apparatus,
- wherein the processor selects any one of the plurality of areas based on a response of the user to hearing a test sound played according to the transmitted test signal, and performs the compensation using the compensation method corresponding to the selected area.

* * * * *